(12) United States Patent
Wang et al.

(10) Patent No.: US 10,462,919 B2
(45) Date of Patent: Oct. 29, 2019

(54) COVER ACCESSORY AND ELECTRONIC DEVICE USING THE SAME

(71) Applicant: Samsung Electronics Co., Ltd., Gyeonggi-do (KR)

(72) Inventors: Sangjin Wang, Gyeonggi-do (KR);
Yunsung Ha, Gyeongsangbuk-do (KR);
Yeongmin Park, Gyeonggi-do (KR);
Sukjin Yun, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/830,230

(22) Filed: Dec. 4, 2017

(65) Prior Publication Data
US 2018/0192532 A1    Jul. 5, 2018

(30) Foreign Application Priority Data

Jan. 4, 2017 (KR) .......................... 10-2017-0001563

(51) Int. Cl.
| | |
|---|---|
| *G06F 1/16* | (2006.01) |
| *H05K 5/03* | (2006.01) |
| *H05K 5/00* | (2006.01) |
| *H04B 1/3888* | (2015.01) |
| *A45C 11/00* | (2006.01) |

(52) U.S. Cl.
CPC ................ *H05K 5/03* (2013.01); *A45C 11/00* (2013.01); *G06F 1/1677* (2013.01); *H04B 1/3888* (2013.01); *H05K 5/0017* (2013.01); *H05K 5/0086* (2013.01); *A45C 2011/002* (2013.01); *G06F 2200/1634* (2013.01)

(58) Field of Classification Search
CPC .... G06F 1/1626; G06F 1/1628; G06F 1/1656; G06F 1/1677; G06F 2200/1633; G06F 2200/1634; H04M 1/0249; H04M 1/0254
USPC ........ 361/679.55, 679.56; 455/575.8; 206/320
See application file for complete search history.

(56) References Cited

U.S. PATENT DOCUMENTS

| | | | |
|---|---|---|---|
| 8,350,874 B2 * | 1/2013 | Lim | G02F 1/133512 345/4 |
| 9,509,361 B1 * | 11/2016 | Kuhl | H04N 5/2252 |
| 2010/0311478 A1 * | 12/2010 | Knoppert | G06F 1/1626 455/575.4 |

(Continued)

FOREIGN PATENT DOCUMENTS

| | | |
|---|---|---|
| KR | 20-2014-0000447 U | 1/2014 |
| KR | 10-1378223 B1 | 3/2014 |

(Continued)

OTHER PUBLICATIONS

International Search Report dated Mar. 5, 2018.

*Primary Examiner* — Anthony Q Edwards
(74) *Attorney, Agent, or Firm* — Cha & Reiter, LLC

(57) ABSTRACT

A cover accessory may include a rear cover that is configured to mount on a mobile communication device; and a front cover that is configured to cover a display of the mobile communication device and comprising a fluorescent material, wherein a light reflection layer facing the display is formed in the central area of the front cover, and in at least a partial area of an edge area enclosing the central area of the front cover, the light reflection layer is not formed.

14 Claims, 23 Drawing Sheets

(56) References Cited

U.S. PATENT DOCUMENTS

| | | | |
|---|---|---|---|
| 2012/0026095 A1* | 2/2012 | Tanaka | G06F 1/1615 345/168 |
| 2012/0069533 A1* | 3/2012 | Liou | G06F 1/1656 361/752 |
| 2013/0045775 A1* | 2/2013 | Heywood | H04B 1/3888 455/557 |
| 2013/0050164 A1* | 2/2013 | Rericha | G06F 1/1626 345/205 |
| 2014/0128132 A1 | 5/2014 | Cox, III | |
| 2014/0323185 A1* | 10/2014 | Lee | H04B 1/3888 455/575.8 |
| 2015/0005034 A1* | 1/2015 | Agnes Desodt | H04B 1/3888 455/566 |
| 2015/0102073 A1* | 4/2015 | Pusateri | H04B 1/3888 224/191 |
| 2015/0155903 A1* | 6/2015 | Jang | H04B 1/3888 455/575.8 |
| 2015/0163940 A1* | 6/2015 | Scott | G06F 1/1656 361/679.01 |
| 2015/0185408 A1* | 7/2015 | Hsu | G02B 6/0088 362/606 |
| 2015/0205184 A1* | 7/2015 | Ellis-Brown | G06F 1/1628 455/575.8 |
| 2015/0356336 A1* | 12/2015 | Hoobler | G06K 7/089 235/455 |
| 2016/0142090 A1* | 5/2016 | Yun | A45C 11/00 455/575.8 |
| 2016/0226547 A1 | 8/2016 | Choi | |
| 2017/0111075 A1* | 4/2017 | Virolainen | H04B 1/3888 |
| 2017/0139442 A1* | 5/2017 | Yoshizumi | G04G 9/04 |
| 2017/0146890 A1* | 5/2017 | Shoemake | G03B 15/05 |
| 2017/0170678 A1* | 6/2017 | Uhm | H02J 50/70 |
| 2017/0300085 A1* | 10/2017 | Hintermann | G06F 1/1626 |
| 2018/0152550 A1* | 5/2018 | Dharmatilleke | H04B 1/3888 |
| 2018/0359343 A1* | 12/2018 | Lee | H04B 1/3888 |
| 2019/0013832 A1* | 1/2019 | Mody | H04M 1/0202 |

FOREIGN PATENT DOCUMENTS

| | | |
|---|---|---|
| KR | 10-2014-0119632 A | 10/2014 |
| KR | 10-2014-0142781 A | 12/2014 |
| KR | 10-2015-0064945 A | 6/2015 |
| KR | 10-2015-0091610 A | 8/2015 |

\* cited by examiner

US 10,462,919 B2

COVER ACCESSORY AND ELECTRONIC DEVICE USING THE SAME

CLAIM OF PRIORITY

The present application claims under 35 U.S.C. § 119(a) the benefit of and priority to Korean patent application Ser. No. 10-2017-0001563 filed on Jan. 4, 2017, the entire disclosure of which is hereby incorporated by reference herein.

TECHNICAL FIELD

The present disclosure generally relates to a cover accessory using a display provided in an electronic device.

BACKGROUND

A cover accessory performs a front surface protection function and performs a privacy protection function by primarily hiding information represented in a display of an electronic device.

When the cover accessory is mounted on the electronic device, it may be difficult for a user to directly determine or view information notified or otherwise displayed on the electronic device.

In order to quickly transfer information of the electronic device to the user, a separate circuit may be used in the cover accessory. In such a case, consumption of a limited battery capacity of the electronic device may increase.

Further, when a cover accessory using a flash light source is mounted at a rear surface of the electronic device, a position of the flash light source is leaned to one side; thus, when viewed from a front surface, visibility of information may be deteriorated.

Thus, conventional cover accessories for electronic devices have several disadvantages including inhibiting viewing of information displayed on the device and diminished battery life.

SUMMARY

The present disclosure has been made in view of the above problem and provides a cover accessory that can reduce a battery use amount of an electronic device by transferring information through the cover accessory even without using a separate circuit or a separate light source.

The present disclosure further provides a cover accessory and an electronic device using the same that are configured to effectively transfer light of an electronic device display using a front cover and that can add a design element to the transferred light using a light reflection layer, an exterior member, or a display screen control and that can have excellent marketability.

In accordance with an aspect of the present disclosure, a cover accessory includes a rear cover that is configured to be mounted on a mobile communication device and a front cover that can cover a display of the mobile communication device and including a fluorescent material, wherein a light reflection layer facing the display is formed in the central area of the front cover, and in at least a partial area of an edge area enclosing the central area of the front cover, the light reflection layer is not formed.

In accordance with another aspect of the present disclosure, a cover accessory includes a rear cover in which a mobile communication device is mounted and a front cover that can cover a display of the mobile communication device and including a fluorescent material, wherein the front cover includes a fluorescent layer facing the display and made of the fluorescent material and a light reflection layer formed on at least a partial area of the fluorescent layer.

In accordance with another aspect of the present disclosure, a mobile communication device includes a display; a sensor for determining whether a cover accessory is mounted; and a processor, wherein the processor controls to acquire identification information occurring in the cover accessory using the sensor, display a first screen in the display when the identification information corresponds to first identification information previously stored in the electronic device (e.g., the mobile communications device), and display a second screen in the display when the identification information corresponds to second identification information previously stored in the electronic device (e.g., the mobile communications device).

These and other aspects and embodiments of the present disclosure are more fully described herein with reference to the accompanying figures.

BRIEF DESCRIPTION OF THE DRAWINGS

The above features, and advantages of the present disclosure will be more apparent from the following detailed description in conjunction with the accompanying drawings, in which.

DETAILED DESCRIPTION

Figure 1:
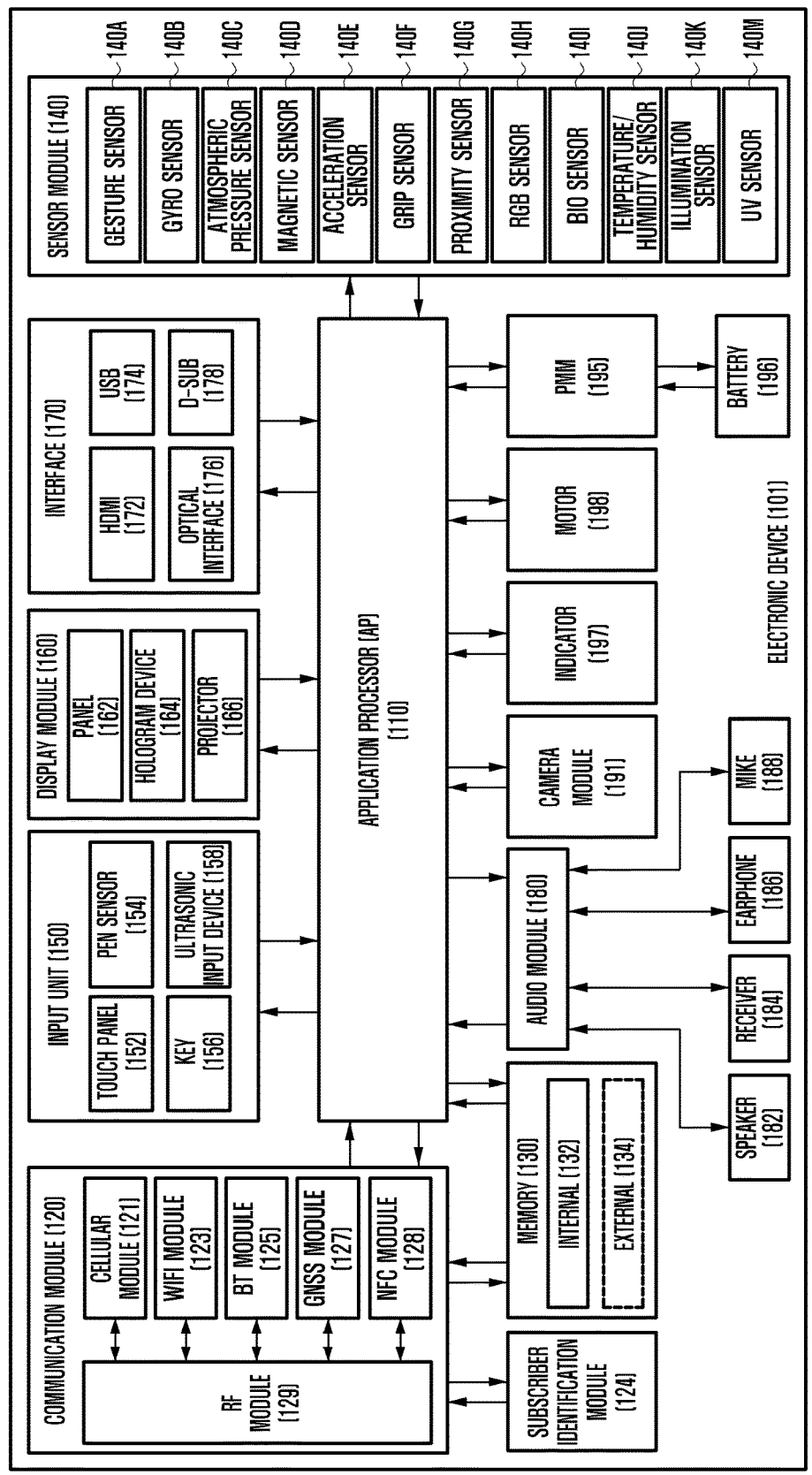
FIG. 1 is a block diagram illustrating a configuration of an electronic device according to various example embodiments of the present disclosure.

As required, a detailed illustrative embodiment of the present disclosure is disclosed herein. However, techniques, systems, compositions and operating structures in accordance with the present disclosure may be embodied in a wide variety of sizes, shapes, forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein which define the scope of the present disclosure.

The expressions such as "include" and "may include" which may be used in the present disclosure denote the presence of the disclosed functions, operations, and constituent elements and do not limit one or more additional functions, operations, and constituent elements. In the present disclosure, the terms such as "include" and/or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

Furthermore, in the present disclosure, the expression "and/or" includes any and all combinations of the associated listed words. For example, the expression "A and/or B" may include A, may include B, or may include both A and B.

In the present disclosure, expressions including ordinal numbers, such as "first" and "second," etc., may modify various elements. However, such elements are not limited by the above expressions. For example, the above expressions do not limit the sequence and/or importance of the elements. The above expressions are used merely for the purpose of distinguishing an element from the other elements. For example, a first user device and a second user device indicate different user devices although both of them are user devices. For example, a first element could be termed a second element, and similarly, a second element could be also termed a first element without departing from the scope of the present disclosure.

In the case where a component is referred to as being "connected" or "accessed" to other component, it should be understood that not only the component is directly connected or accessed to the other component, but also there may exist another component between them. Meanwhile, in the case where a component is referred to as being "directly connected" or "directly accessed" to other component, it should be understood that there is no component therebetween. The terms used in the present disclosure are only used to describe specific various embodiments, and are not intended to limit the present disclosure. As used herein, the singular forms are intended to include the plural forms as well, unless the context clearly indicates otherwise. Singular forms are intended to include plural forms unless the context clearly indicates otherwise.

An electronic device according to the present disclosure may be a device including a communication function. For example, the device corresponds to a combination of at least one of a smartphone, a tablet Personal Computer (PC), a mobile phone, a video phone, an e-book reader, a desktop PC, a laptop PC, a netbook computer, a Personal Digital Assistant (PDA), a Portable Multimedia Player (PMP), a digital audio player, a mobile medical device, an electronic bracelet, an electronic necklace, an electronic accessory, a camera, a wearable device, an electronic clock, a wrist watch, home appliances (for example, an air-conditioner, vacuum, an oven, a microwave, a washing machine, an air cleaner, and the like), an artificial intelligence robot, a television (TV), a Digital Video Disk (DVD) player, an audio device, various medical devices (for example, Magnetic Resonance Angiography (MRA), Magnetic Resonance Imaging (MRI), Computed Tomography (CT), a scanning machine, a ultrasonic wave device, or the like), a navigation device, a Global Positioning System (GPS) receiver, an Event Data Recorder (EDR), a Flight Data Recorder (FDR), a set-top box, a TV box (for example, Samsung HomeSync™, Apple TV™, or Google TV™), an electronic dictionary, vehicle infotainment device, an electronic equipment for a ship (for example, navigation equipment for a ship, gyrocompass, or the like), avionics, a security device, electronic clothes, an electronic key, a camcorder, game consoles, a Head-Mounted Display (HMD), a flat panel display device, an electronic frame, an electronic album, furniture or a portion of a building/structure that includes a communication function, an electronic board, an electronic signature receiving device, a projector, and the like. It will be obvious to those skilled in the art that the electronic device according to the present disclosure is not limited to the aforementioned devices.

FIG. 1 is a block diagram illustrating an electronic device 101 in accordance with an embodiment of the present disclosure. Referring to FIG. 1, the electronic device 101 may include at least one application processor (AP) 110, a communication module 120, a subscriber identification module (SIM) card 124, a memory 130, a sensor module 140, an input device 150, a display 160, an interface 170, an audio module 180, a camera module 191, a power management module 195, a battery 196, an indicator 197, and a motor 198.

The AP 110 may drive an operating system or applications, control a plurality of hardware or software components connected thereto, and also perform processing and operation for various data including multimedia data. The AP 110 may be formed of system-on-chip (SoC), for example. According to an embodiment, the AP 110 may further include a graphic processing unit (GPU) (not shown).

The communication module 120 (e.g., the communication interface 170) may perform a data communication with any other electronic device (e.g., the electronic device 104 or the server 106) connected to the electronic device 100 (e.g., the electronic device 101) through the network. According to an embodiment, the communication module 120 may include: a cellular module 121, a WiFi module 323, a BT module 125, a GPS module 127, an NFC module 128, and/or an RF (Radio Frequency) module 129.

The cellular module 121 may offer a voice call, a video call, a message service, an internet service, or the like through a communication network (e.g., LTE, LTE-A, CDMA, WCDMA, UMTS, WiBro, or GSM, etc.). Additionally, the cellular module 121 may perform identification and authentication of the electronic device in the communication network, using the SIM card 124. According to an embodiment, the cellular module 121 may perform at least part of functions the AP 110 can provide. For example, the cellular module 121 may perform at least part of a multimedia control function.

According to an embodiment, the cellular module 121 may include a communication processor (CP). Additionally, the cellular module 121 may be formed of SoC, for example. Although some elements such as the cellular module 121 (e.g., the CP), the memory 130, or the power management module 195 are shown as separate elements being different from the AP 110, the AP 110 may be formed to have at least part of the above elements in an embodiment.

According to an embodiment, the AP 110 or the cellular module 121 (e.g., the CP) may load commands or data, received from a nonvolatile memory connected thereto or from at least one of the other elements, into a volatile memory to process them. Additionally, the AP 110 or the cellular module 121 may store data, received from or created at one or more of the other elements, in the nonvolatile memory.

Each of the WiFi module 123, the BT module 125, the GPS module 127 and the NFC module 128 may include a processor for processing data transmitted or received therethrough. Although FIG. 1 shows the cellular module 121, the WiFi module 123, the BT module 125, the GPS module 127 and the NFC module 128 as different blocks, at least part of them may be contained in a single IC (Integrated Circuit) chip or a single IC package in an embodiment. For example, at least part (e.g., the CP corresponding to the cellular module 121 and a WiFi processor corresponding to the WiFi module 123) of respective processors corresponding to the cellular module 121, the WiFi module 123, the BT module 125, the GPS module 127 and the NFC module 128 may be formed as a single SoC.

The RF module 129 may transmit and receive data, such as RF signals or any other electric signals, for example. Although not shown, the RF module 129 may include a transceiver, a PAM (Power Amp Module), a frequency filter, an LNA (Low Noise Amplifier), or the like. Also, the RF module 129 may include any component, e.g., a wire or a conductor, for transmission of electromagnetic waves in a free air space. Although FIG. 1 shows that the cellular module 121, the WiFi module 123, the BT module 125, the GPS module 127 and the NFC module 128 share the RF module 129, at least one of them may perform transmission and reception of RF signals through a separate RF module in an embodiment.

The SIM card 124 may be a specific card formed of SIM and may be inserted into a slot formed at a certain place of the electronic device 101. The SIM card 124 may contain therein an ICCID (Integrated Circuit Card Identifier) or an IMSI (International Mobile Subscriber Identity).

The memory 130 (e.g., the memory 130) may include an internal memory 132 and an external memory 134. The internal memory 132 may include, for example, at least one of a volatile memory (e.g., DRAM (Dynamic RAM), SRAM (Static RAM), SDRAM (Synchronous DRAM), etc.) or a nonvolatile memory (e.g., OTPROM (One Time Programmable ROM), PROM (Programmable ROM), EPROM (Erasable and Programmable ROM), EEPROM (Electrically Erasable and Programmable ROM), mask ROM, flash ROM, NAND flash memory, NOR flash memory, etc.).

According to an embodiment, the internal memory 132 may have the form of an SSD (Solid State Drive). The external memory 134 may include a flash drive, e.g., CF (Compact Flash), SD (Secure Digital), Micro-SD (Micro Secure Digital), Mini-SD (Mini Secure Digital), xD (Extreme Digital), memory stick, or the like. The external memory 334 may be functionally connected to the electronic device 101 through various interfaces. According to an embodiment, the electronic device 301 may further include a storage device or medium such as a hard drive.

The sensor module 140 may measure physical quantity or sense an operating status of the electronic device 101, and then convert measured or sensed information into electric signals. The sensor module 140 may include, for example, at least one of a gesture sensor 140A, a gyro sensor 140B, an atmospheric sensor 140C, a magnetic sensor 140D, an acceleration sensor 140E, a grip sensor 140F, a proximity sensor 140G, a color sensor 140H (e.g., RGB (Red, Green, Blue) sensor), a biometric sensor 140I, a temperature-humidity sensor 140J, an illumination sensor 140K, and a UV (ultraviolet) sensor 140M. Additionally or alternatively, the sensor module 140 may include, e.g., an E-nose sensor (not shown), an EMG (electromyography) sensor (not shown), an EEG (electroencephalogram) sensor (not shown), an ECG (electrocardiogram) sensor (not shown), an IR (infrared) sensor (not shown), an iris scan sensor (not shown), or a finger scan sensor (not shown). Also, the sensor module 140 may include a control circuit for controlling one or more sensors equipped therein.

The input device 150 may include a touch panel 152, a digital pen sensor 154, a key 156, and/or an ultrasonic input unit 158. The touch panel 152 may recognize a touch input in a manner of capacitive type, resistive type, infrared type, or ultrasonic type. Also, the touch panel 152 may further include a control circuit. In case of a capacitive type, a physical contact or proximity may be recognized. The touch panel 152 may further include a tactile layer. In this case, the touch panel 152 may offer a tactile feedback to a user.

The digital pen sensor 154 may be formed in the same or similar manner as receiving a touch input or by using a separate recognition sheet. The key 156 may include, for example, a physical button, an optical key, and/or a keypad. The ultrasonic input unit 158 is a specific device capable of identifying data by sensing sound waves with a microphone 188 in the electronic device 101 through an input tool that generates ultrasonic signals, thus allowing wireless recognition. According to an embodiment, the electronic device 101 may receive a user input from any external device (e.g., a computer or a server) connected thereto through the communication module 120.

The display 160 may include a panel 162, a hologram 164, or a projector 166. The panel 162 may be, for example, LCD (Liquid Crystal Display), AM-OLED (Active Matrix Organic Light Emitting Diode), or the like. The panel 162 may have a flexible, transparent or wearable form. The panel 162 may be formed of a single module with the touch panel 152. The hologram 164 may show a stereoscopic image in the air using interference of light. The projector 166 may project an image onto a screen, which may be located at the inside or outside of the electronic device 101. According to an embodiment, the display 160 may further include a control circuit for controlling the panel 162, the hologram 164, and the projector 166.

The interface 170 may include, for example, an HDMI (High-Definition Multimedia Interface) 172, a USB (Universal Serial Bus) 174, an optical interface 176, or a D-sub (D-subminiature) 178. Additionally or alternatively, the interface 170 may include, for example, an MHL (Mobile High-definition Link) interface, an SD (Secure Digital) card/MMC (Multi-Media Card) interface, or an IrDA (Infrared Data Association) interface.

The audio module 180 may perform a conversion between sounds and electric signals. The audio module 180 may process sound information inputted or outputted through a speaker 182, a receiver 184, an earphone 186, and/or a microphone 188.

The camera module 191 is a device capable of obtaining still images and moving images. According to an embodiment, the camera module 191 may include at least one image sensor (e.g., a front sensor or a rear sensor), a lens (not shown), an ISP (Image Signal Processor, not shown), or a flash (e.g., LED or xenon lamp, not shown).

The power management module 195 may manage electric power of the electronic device 101. Although not shown, the power management module 195 may include, for example, a PMIC (Power Management Integrated Circuit), a charger IC, or a battery or fuel gauge.

The PMIC may be formed, for example, of an IC chip or SoC. Charging may be performed in a wired or wireless manner. The charger IC may charge a battery 196 and prevent overvoltage or overcurrent from a charger. According to an embodiment, the charger IC may have a charger IC used for at least one of wired and wireless charging types. A wireless charging type may include, for example, a magnetic resonance type, a magnetic induction type, or an electromagnetic type. Any additional circuit for a wireless charging may be further used such as a coil loop, a resonance circuit, or a rectifier.

The battery gauge may measure the residual amount of the battery 196 and a voltage, current or temperature in a charging process. The battery 196 may store or create electric power therein and supply electric power to the electronic device 101. The battery 196 may be, for example, a rechargeable battery or a solar battery.

The indicator 197 may show thereon a current status (e.g., a booting status, a message status, or a recharging status) of the electronic device 101 or of its part (e.g., the AP 110). The motor 198 may convert an electric signal into a mechanical vibration. Although not shown, the electronic device 301 may include a specific processor (e.g., GPU) for supporting a mobile TV. This processor may process media data that comply with standards of DMB (Digital Multimedia Broadcasting), DVB (Digital Video Broadcasting), or media flow.

Each of the above-discussed elements of the electronic device disclosed herein may be formed of one or more components, and its name may be varied according to the type of the electronic device. The electronic device disclosed herein may be formed of at least one of the above-discussed elements without some elements or with additional other elements. Some of the elements may be integrated into a single entity that still performs the same functions as those of such elements before integrated.

The term "module" used in this disclosure may refer to a certain unit that includes one of hardware, software and firmware or any combination thereof. The module may be interchangeably used with unit, logic, logical block, component, or circuit, for example. The module may be the minimum unit, or part thereof, which performs one or more particular functions. The module may be formed mechanically or electronically. For example, the module disclosed herein may include at least one of ASIC (Application-Specific Integrated Circuit) chip, FPGAs (Field-Programmable Gate Arrays), and programmable-logic device, which have been known or are to be developed.

FIGS. 2A to 2F are a set of 6 drawings illustrating a cover accessory according to an example embodiment of the present disclosure. FIGS. 2A to 2F illustrate a cover accessory in a state which may be mounted on an electronic device 200 and in which a front cover 201 is closed according to an example embodiment of the present disclosure.

Figure 2A:
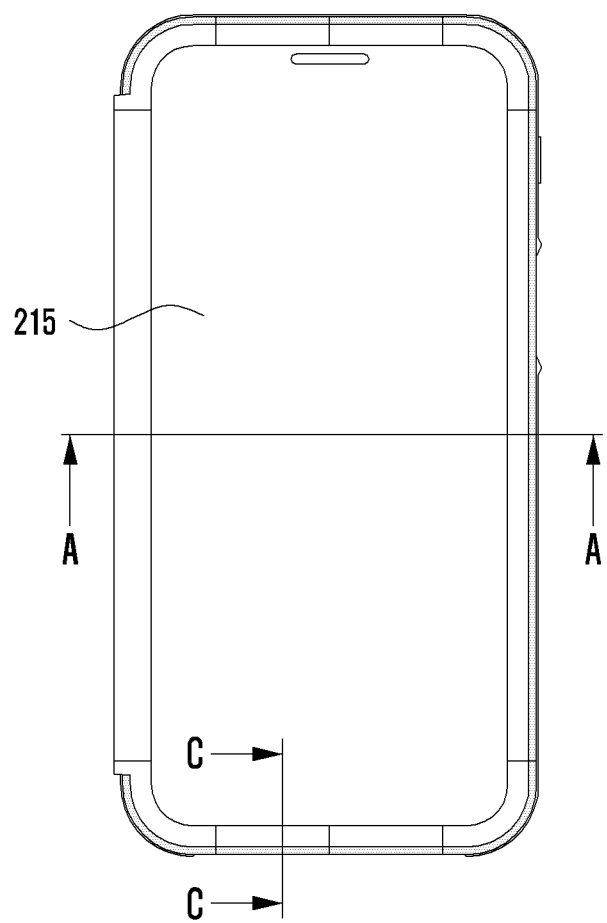
FIG. 2A is a front view of a cover accessory according to an example embodiment of the present disclosure.
Figure 2B:
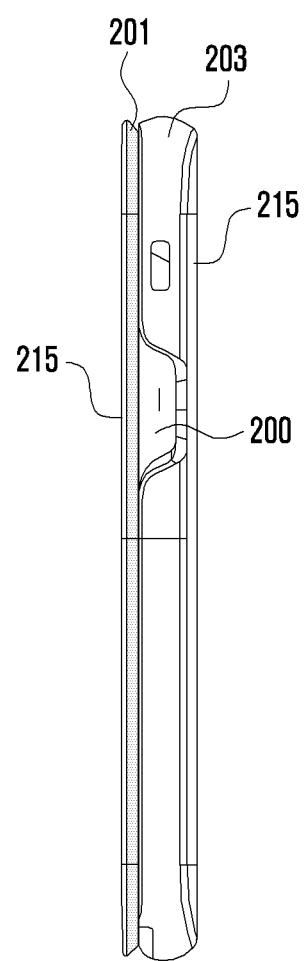
FIG. 2B is a right side view of the cover accessory of FIG. 2A.
Figure 2C:
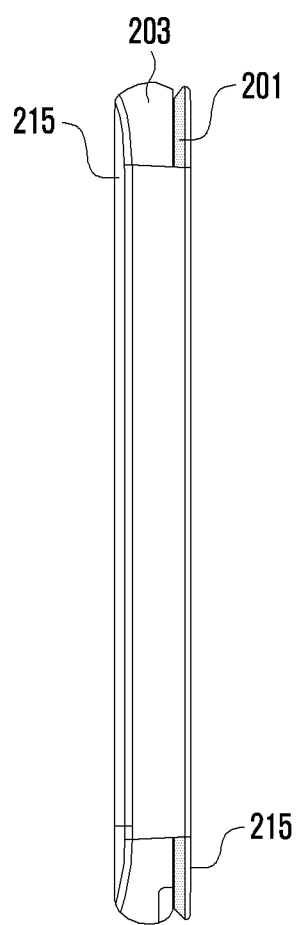
FIG. 2C is a left side view of the cover accessory of FIG. 2A.
Figure 2D:
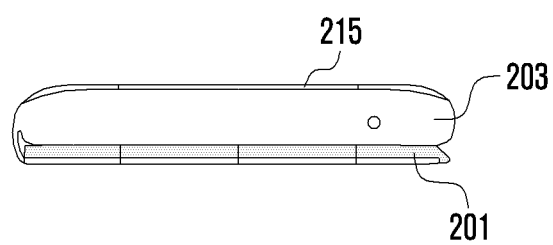
FIG. 2D is a top plan view of the cover accessory of FIG. 2A.
Figure 2E:
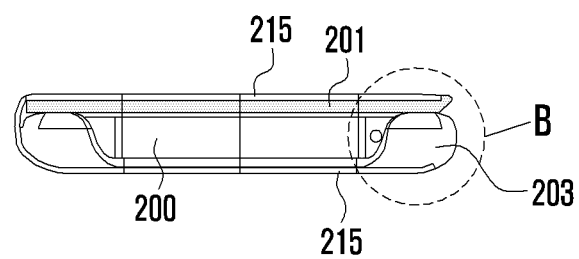
FIG. 2E is a bottom view of the cover accessory of FIG. 2A.
Figure 2F:
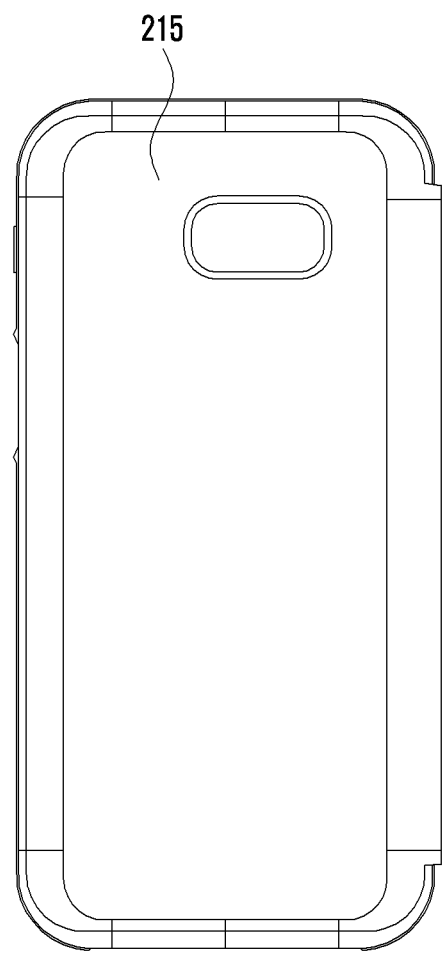
FIG. 2F is a rear view of the cover accessory of FIG. 2A.

Specifically, FIGS. 2A to 2F are a set of 6 drawings of a cover accessory and FIG. 2A is a front view, FIG. 2B is a right side view, FIG. 2C is a left side view, FIG. 2D is a top plan view, FIG. 2E is a bottom view, and FIG. 2F is a rear view. A direction of the drawing is set for better understanding of the present disclosure and is not an absolute reference.

In an example embodiment, the electronic device 200 may include a mobile communication device in which a communication module 120 is mounted.

A cover accessory according to an example embodiment of the present disclosure has a structure in which the front cover 201 is opened or closed by rotating based on a left outer edge end portion in FIG. 2A, but the rotation center of the front cover 201 is not limited to a left outer edge end portion and may be freely changed to right, upper, and lower outer edge end portions, as needed. However, in the present example embodiment, for better understanding, it is assumed that the front cover 201 rotates about a left outer edge end portion.

Figure 2G:
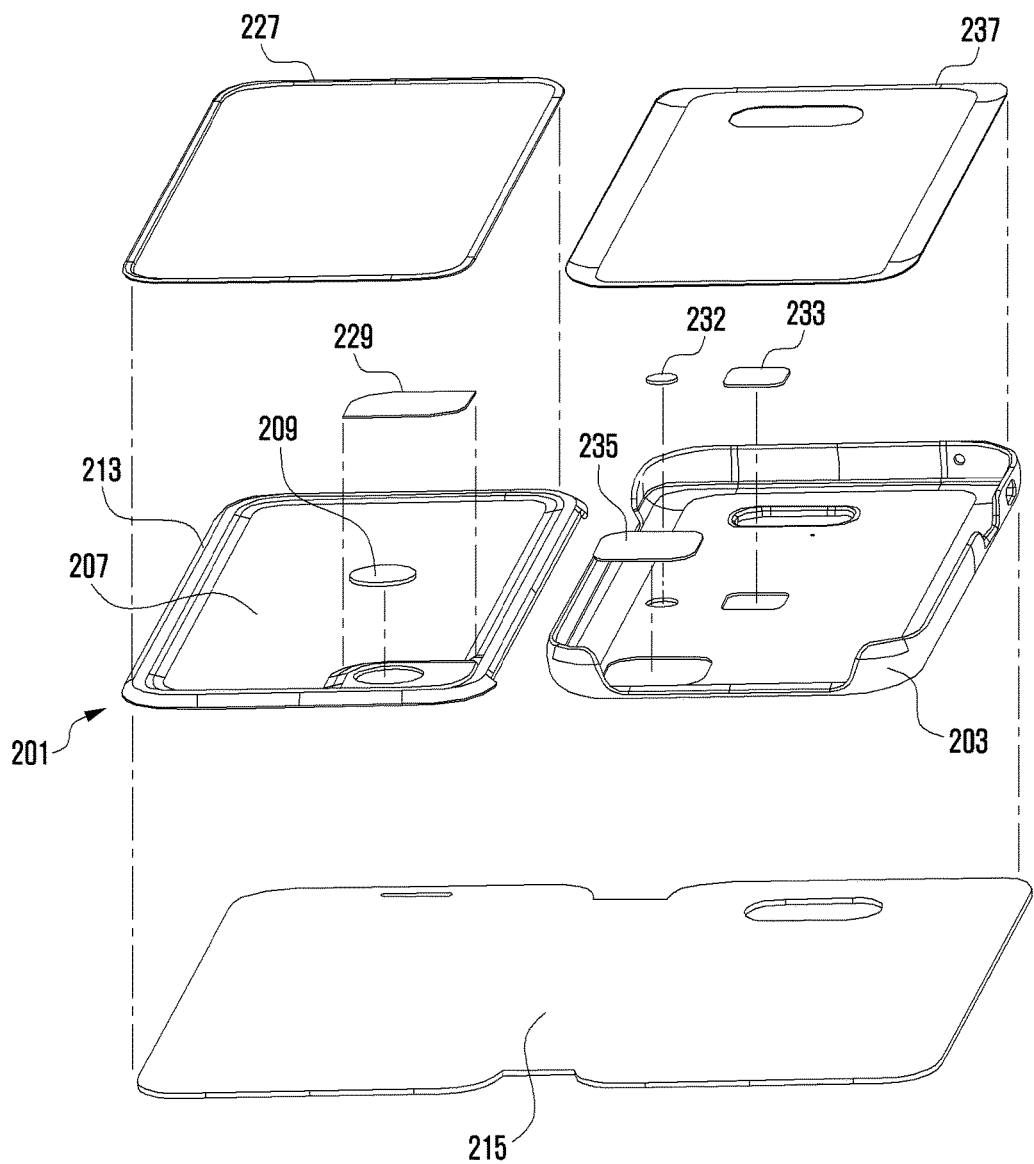
FIG. 2G is an exploded perspective view illustrating a cover accessory according to an example embodiment of the present disclosure.
Figure 3:
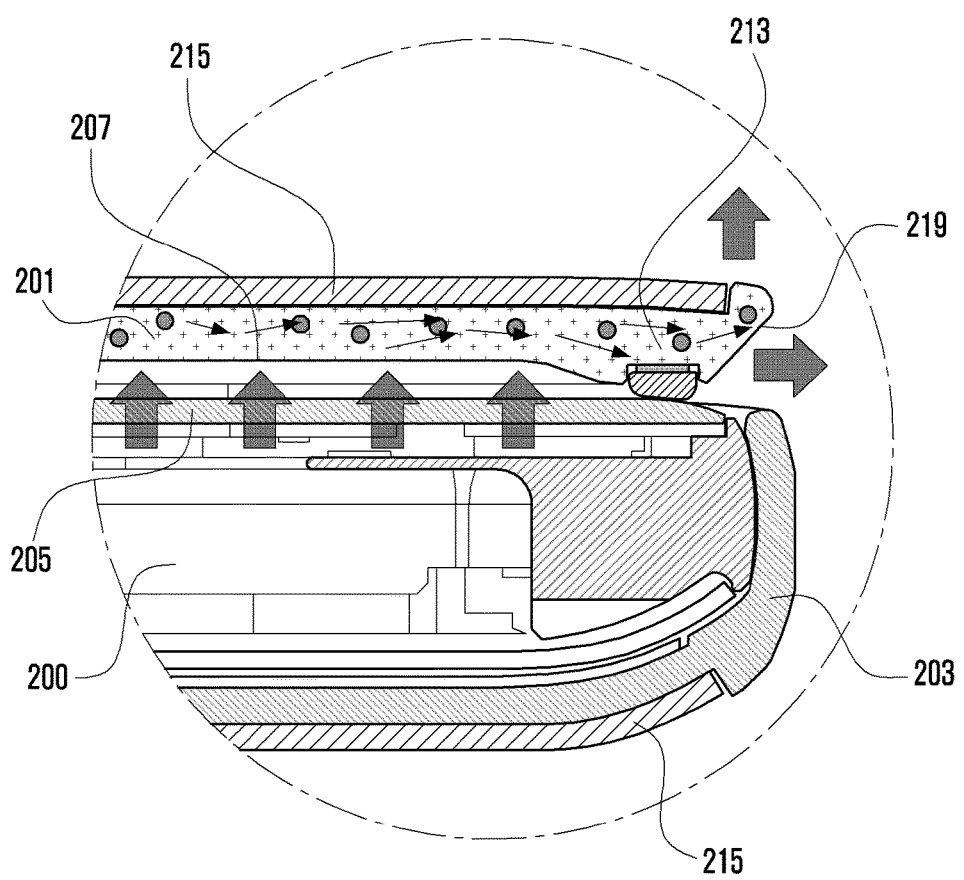
FIG. 3 and FIG. 4 are enlarged views illustrating a portion B of FIG. 2E.
Figure 4:
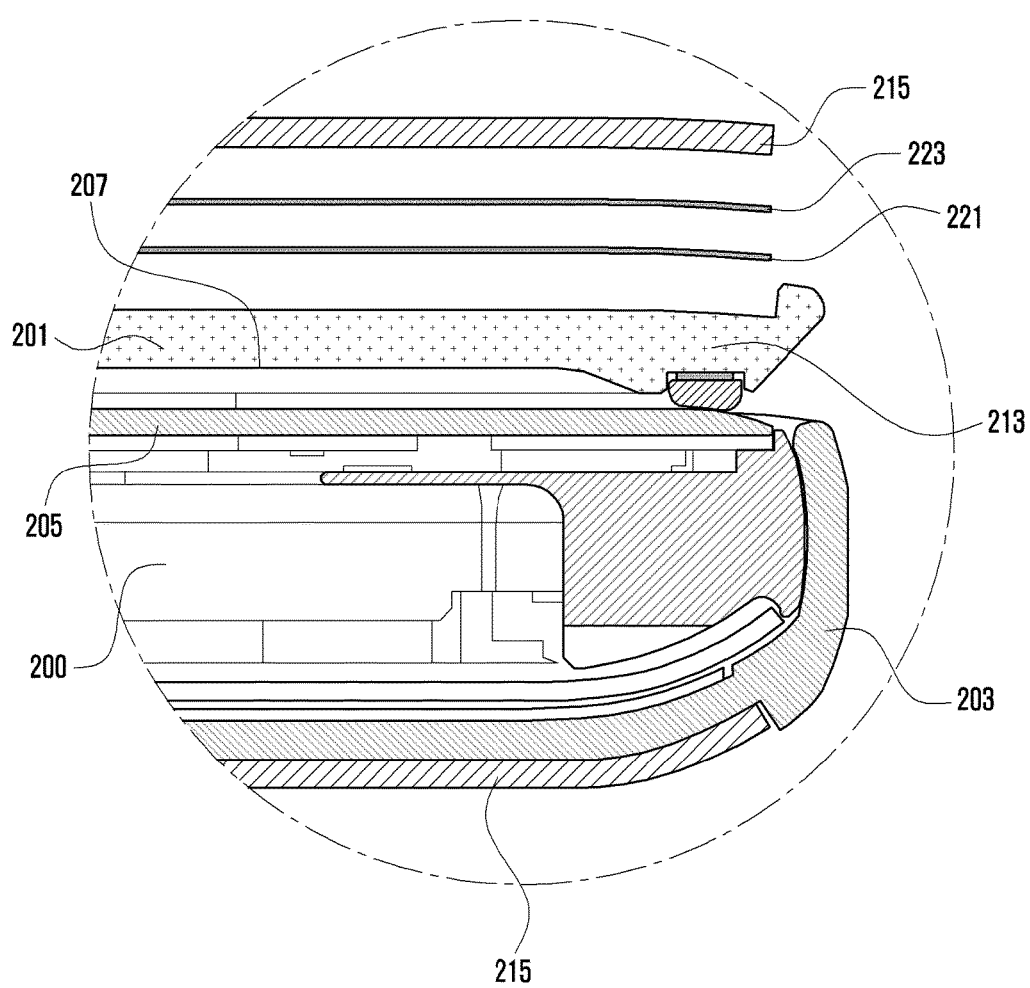

With reference to FIGS. 2 to 4, a cover accessory according to various example embodiments of the present disclosure may include a rear cover 203 in which an electronic device is mounted, a front cover 201 that covers a display 205 (see FIG. 3) of the electronic device 200 and that transfers light occurring in the display 205 and a light reflection layer 221 (see FIG. 4) formed in a central area 207 of the front cover 201. For better understanding, a more detailed configuration will be described with reference to the exploded perspective view of FIG. 2G.

FIG. 2G is an exploded perspective view illustrating a cover accessory according to an example embodiment of the present disclosure.

With reference to FIG. 2G, a cover accessory according to an example embodiment of the present disclosure may include a rear cover 203 in which an electronic device may be mounted, a front cover 201 that covers the display 205 of the electronic device 200 and that transfers light occurring in the display 205, and a light reflection layer 221 (see FIG. 4) formed in a central area 207 of the front cover 201.

The front cover 201 may be configured with a central area 207 and an edge area 213 enclosing the central area. The front cover 201 may include a fluorescent material and transfer light occurring in the display 205 of the electronic device to the edge area 213 through a fluorescent material. The front cover 201 may include a fluorescent material and may be disposed to form one layer.

In an example embodiment of various example embodiments of the present disclosure, as shown in FIG. 2G, the rear cover 203 may be formed in a cradle shape. The rear cover 203 is provided in a cradle shape to enable the electronic device to be more stably mounted. In addition, the rear cover 203 may be formed in various shapes, in which the electronic device may be mounted, such as a clip shape.

At the inside of the rear cover 203, in order to prevent scratch damage from occurring in the electronic device 200 because of a friction with the rear cover 203, a cradle finishing material 237 may be provided.

When the front cover 201 is closed, the front cover 201 may be configured with one surface facing the display 205 and the other surface, which is a surface opposite to the one surface.

At the other surface, an exterior member 215 having a material different from that of the front cover 201 may be formed. As an outer edge end portion of one side of the exterior member 215 is extended to be connected to an outer edge end portion of one side of the rear cover 203, the exterior member 215 may enable the front cover 201 to be opened or closed. As the outer edge end portion of one side of the exterior member 215 is extended to enclose an outer side surface of the rear cover 203 and to be connected to the outer side surface of the rear cover 203, the exterior member 215 may enable the front cover 201 to be opened or closed.

In another example embodiment of the present disclosure, as the outer edge end portion of one side of the rear cover 203 is connected to an outer edge end portion of one side of the front cover 201 instead of the exterior member 215, the rear cover 203 may enable the front cover 201 to be opened or closed. This will be described later with reference to FIG. 5B.

The exterior member 215 may be made of, for example, a polyurethane (PU) material and be produced with several colors using various pigments, thereby enabling a user to select various products and providing an aesthetic feeling to the user.

At one surface of the front cover 201, a magnetic body 209 may be provided (see FIG. 2G). The magnetic body 209 may enable the electronic device 200 to recognize whether the front cover 201 is opened or closed.

The magnetic body 209 may be provided adjacent to an outer edge end portion of one side to be the rotation center of the front cover 201 at one surface of the front cover 201. A magnetic body finishing material 229 may be provided such that the magnetic body 209 is not directly exposed at the outside.

By positioning the magnetic body 209 in a position adjacent to an outer edge end portion of one side to be the rotation center of the front cover 201, a displacement according to a rotation of the front cover 201 may be reduced, and the electronic device 200 may more quickly recognize whether the front cover 201 is opened or closed.

The other surface may be positioned at a lower portion of a rear cover with a rotation of the front cover 201. In this case, in order to prevent the electronic device 200 from erroneously recognizing as a closing situation of the front cover 201, a shield plate 235, which may be formed from steel for example, that blocks a magnetic force of the magnetic body 209 may be provided.

In the front cover 201, an elastic member 227 may be provided along the edge area 213 of the front cover 201. When the front cover 201 is closed, the elastic member 227 may contact the display 205 to provide a frictional force, thereby preventing the front cover 201 from slipping and moving on the display 205.

The elastic member 227 may block the edge area 213 of the front cover 201 from directly contacting with the display 205 to prevent scratch damage from occurring in the display 205 through mutual friction.

In the rear cover 203, an identification element 233 may be provided. The identification element 233 may provide identification information of the cover accessory to the electronic device 200. The identification element 233 may transmit information related to the cover accessory to the electronic device 200 through short range wireless communication.

In the rear cover 203, a cradle recognition element 232 may be provided. The cradle recognition element 232 may provide information on whether the electronic device 200 is mounted in the cover accessory to the electronic device 200. The cradle recognition element 232 may transmit information related to the cover accessory to the electronic device 200 through short range wireless communication.

The sensor 140 provided in the electronic device 200 according to an example embodiment of the present disclosure may receive information provided by the identification element 233 or the cradle recognition element 232.

There are various short range wireless communication methods in which the identification element 233 or the cradle recognition element 232 may be used for providing information to the sensor 140. For example, the short range wireless communication method may include at least one of wireless fidelity (WiFi), Bluetooth, Bluetooth low energy (BLE), Zigbee, near field communication (NFC), magnetic secure transmission, a radio frequency (RF), and a body area network (BAN).

FIGS. 3 and 4 are enlarged views illustrating a portion B of FIG. 2E.

The front cover 201 may be configured with a central area 207 and an edge area 213 enclosing the central area. According to an example embodiment, the edge area 213 may correspond to a black mask area in an area of the display 205 of the electronic device 200, and the central area 207 may correspond to a light emitting area among an area of the display 205 of the electronic device 200.

Specifically, FIG. 3 illustrates a process in which light occurring in the display 205 of the electronic device 200 according to an example embodiment of the present disclosure is transferred to the edge area 213 of the front cover 201. Light may be transferred to the edge area 213 through a chain process in which light occurring in the display 205 of the electronic device 200 is supplied to a fluorescent material included in the front cover 201 and in which the fluorescent material (e.g., fluorescent resin), having received the light, again emits light to supply light to a peripheral another fluorescent material.

When the front cover 201 is closed, the front cover 201 may be configured with one surface facing the display 205 and the other surface, which is a surface opposite to the one surface. In the edge area 213 of the front cover 201, an inclined surface 219 formed from the other surface of the front cover 201 toward the one surface and forming an acute angle with the other surface may be formed. In an example embodiment according to the present disclosure, an angle formed by the other surface of the front cover 201 and the inclined surface 219 may be in a range of 30° to 60°. That is, when the front cover 201 is closed, the inclined surface 219 formed in the edge area 213 may be formed to face the display 205 side of the electronic device 200.

When light occurring in the display 205 is transferred to the edge area 213 of the front cover 201, the inclined surface 219 may convert a direction of a portion of light toward the other surface of the front cover 201. Thus, advantageously, even in a situation in which the front cover 201 is closed, the user may recognize light emitted from the edge area 213.

When light occurring in the display 205 is transferred to the edge area 213 of the front cover 201, the inclined surface 219 may enable light transmitted to the inclined surface 219 to be emitted to the rear cover 203 side as well as a side surface. Thus, advantageously, even when the display 205 side of the electronic device 200 is put toward the bottom, the user may recognize light emitted through the inclined surface 219 of the edge area 213.

At least a portion of the central area 207 of the front cover 201 may have a thickness smaller than that of the edge area 213. Because at least a portion of the central area 207 has a thickness smaller than that of the edge area 213, when the front cover 201 is closed, an area that directly contacts the display 205 may be reduced; thus, the front cover 201 is prevented from rubbing with the display 205 to prevent scratch damage from occurring.

FIG. 4 is a diagram illustrating a disposition relationship of the front cover 201, the light reflection layer 221, a light shield layer 223, and the exterior member 215.

When the front cover 201 is closed, the front cover 201 may be configured with one surface facing the display 205 and the other surface, which is a surface opposite to the one surface.

At the other surface of the front cover 201, the exterior member 215 having a material different from that of the front cover 201 may be formed. Because an outer edge end portion of one side of the exterior member 215 is connected to an outer edge end portion of one side of the rear cover 203, the front cover 201 may be opened or closed.

The exterior member 215 may perform a function of blocking release of light through the central area 207 such that a user may recognize light received from the display 205 only through the edge area 213 of the front cover 201. As described above, the inclined surface 219 may increase an amount of light emitted through the edge area 213 of the other surface side of the front cover 201, thereby increasing user visibility.

The light reflection layer 221 may be positioned between the front cover 201 and the exterior member 215. The light reflection layer 221 may perform a function of transferring light applied to the front cover 201 to the edge area 213 instead of being released through the other surface of the front cover 201. The light reflection layer 221 may increase brightness of the light released from the edge area 213.

The light reflection layer 221 may be configured with one reflect area having the same reflect characteristic, and in some cases, the light reflection layer 221 may be divided into at least two different reflection areas having different reflection characteristics. In the at least two different reflection areas, at least one of reflectivity, a reflection direction, and a reflection pattern, or a combination thereof, may be differently formed. For example, by differently configuring reflectivity of at least two reflection areas or by adjusting a reflection direction by forming a predetermined pattern in the light reflection layer 221 by configuring a material forming the light reflection layer 221 with different kinds of materials, an amount of light transferred to the edge area 213 may be differently adjusted.

The light shield layer 223 may be further provided between the light reflection layer 221 and the exterior member 215. By performing a function of blocking light emitted through the other surface of the front cover 201, the light shield layer 223 together with the light reflection layer 221 may perform a function of maximizing light and shade contrast of the exterior member 215 and the edge area 213 and enhancing user visibility.

Because the exterior member 215, the light reflection layer 221, and the light shield layer 223 are separated by a predetermined distance from an outer edge end portion of the front cover 201, a surface area thereof may be smaller than that of the other surface of the front cover 201. Thus, even in a state in which the front cover is closed, the user may recognize light through a partial area of the other surface of the front cover 201.

Figure 5A:
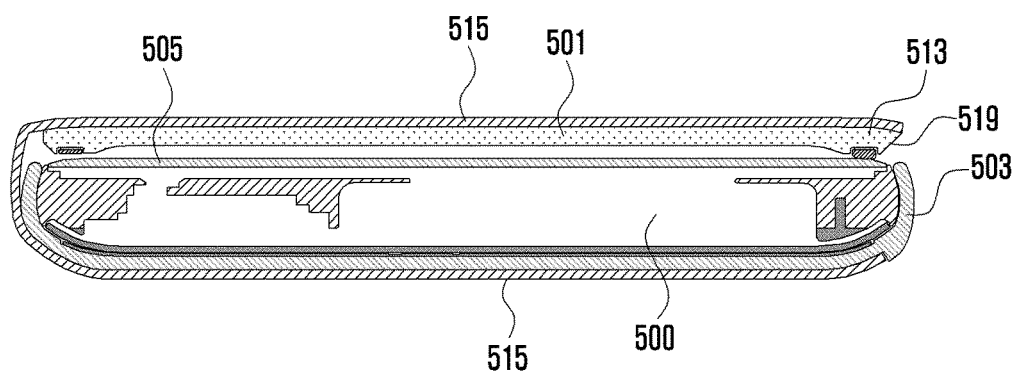
FIG. 5A and FIG. 5B are cross-sectional views illustrating the cover accessory taken along line A-A of FIG. 2A.
Figure 5B:
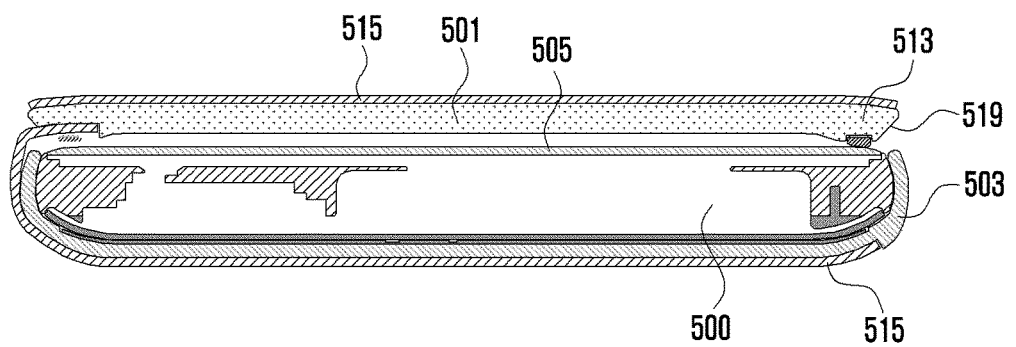

FIGS. 5A and 5B are cross-sectional views illustrating the cover accessory taken along line A-A of FIG. 2A.

With reference to FIG. 5A, because an outer edge end portion of one side of an exterior member 515 is connected to an outer edge end portion of one side of a rear cover 503, the rotation center of a front cover 501 may be provided, such as a hinge for opening and closing the front cover 601. In an example embodiment of various example embodiments of the present disclosure, because the exterior member 515 encloses an outer side surface of the rear cover 503 to be connected thereto, the exterior member 515 may be produced as one component, thereby simplifying a production process and reducing production costs.

When an outer edge end portion of one side of the exterior member 515 is extended to be connected to an outer edge end portion of one side of the rear cover 503, an edge area 513 of the outer edge end portion of one side of the front cover 501 may be covered. Therefore, as shown in FIG. 5B, the exterior member 515 encloses an outer side surface of the rear cover 503, and the outer edge end portion of one side of the exterior member 515 is coupled to the front cover 501; thus, the edge area 513 may not be covered. In this case, the exterior member 515 may be additionally provided at the other surface of the front cover 501.

According to various example embodiments of the present disclosure, the exterior member 515 may be substantially the same as a surface area of the other surface of the front cover 501. Thereby, an amount of light emitted through an inclined surface 519 of the edge area 513 is increased, but a user's feeling of eye fatigue from bright light may be reduced by a reduction in an amount of light emitted through the other surface of the front cover 501.

FIG. 6 is a cross-sectional view illustrating a cover accessory taken along line A-A of FIG. 2A and is an enlarged view of a portion B of FIG. 2E corresponding thereto. Specifically, FIG. 6 illustrates a case in which a display 605 of the electronic device forms a curved surface. Because the display 605 of the electronic device forms a curved surface, a front cover 601 may be also formed in a curved surface to correspond thereto.

Figure 6A:
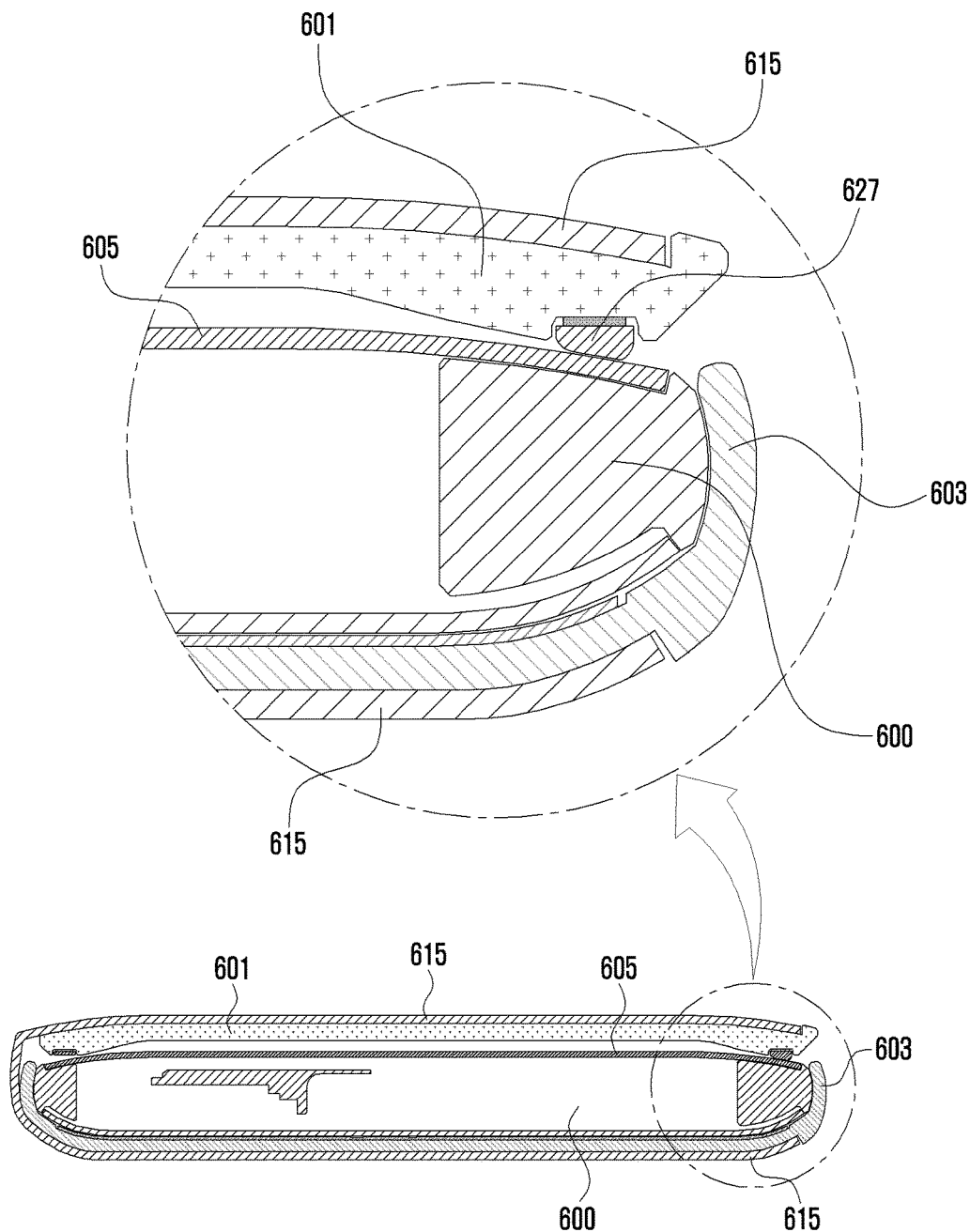
FIG. 6A and FIG. 6B are cross-sectional views illustrating the cover accessory taken along line A-A of FIG. 2A.
Figure 6B:
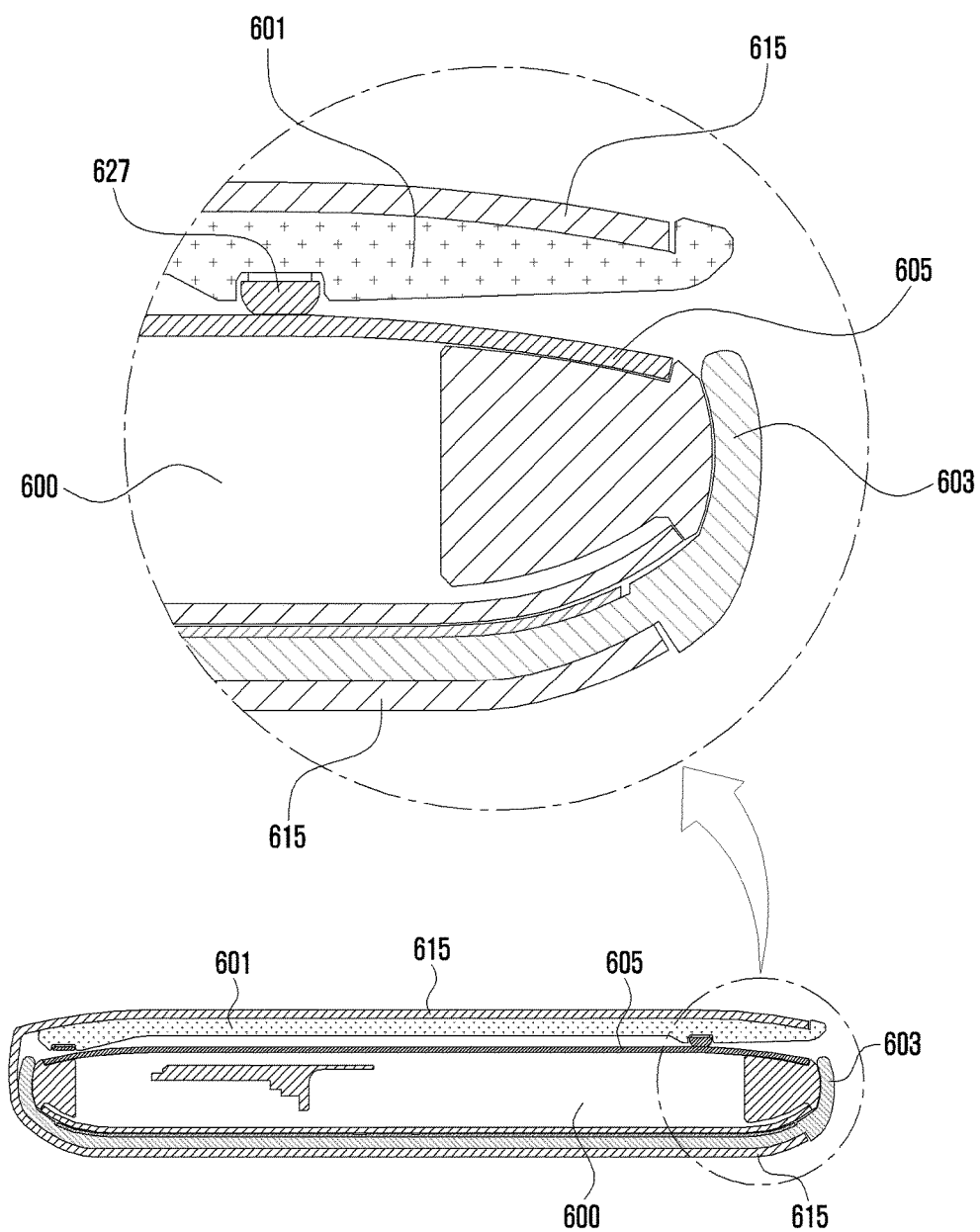

Further, in order to prevent the front cover 601 from slipping and moving on the display 605, an elastic member 627 may be disposed at a curved portion of a surface of the display 605, as shown in FIG. 6A, or at a flat portion of a surface of the display 605, as shown in FIG. 6B.

Figure 7A:
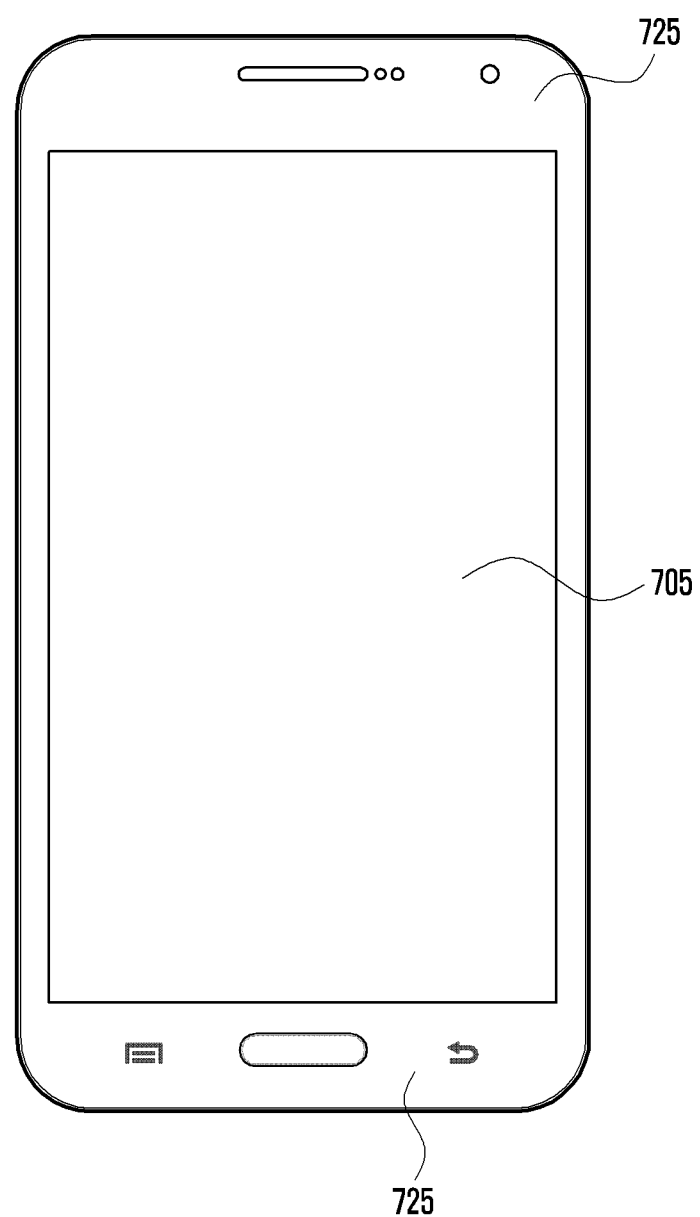
FIG. 7A and FIG. 7B are cross-sectional views illustrating the cover accessory taken along line C-C of FIG. 2A.
Figure 7B:
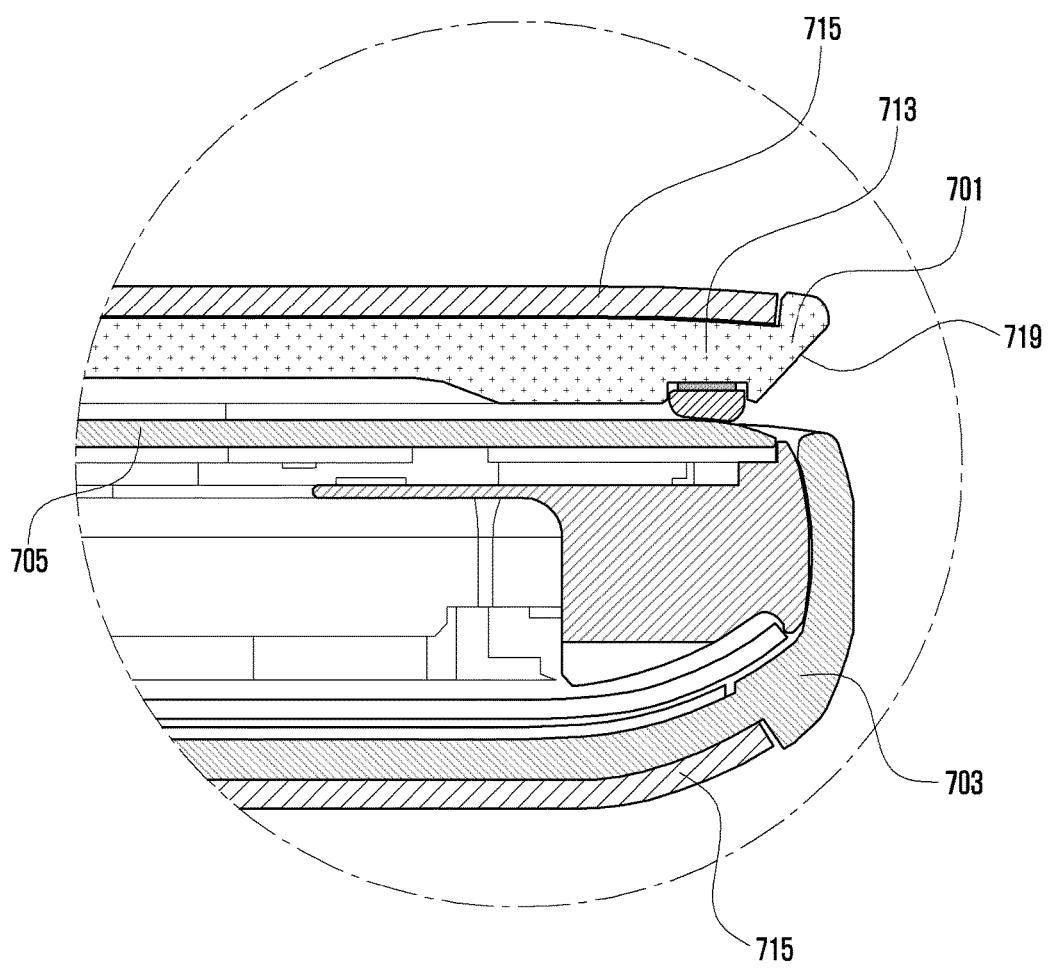

FIG. 7A illustrates a front surface of a general electronic device 101, and FIG. 7B is a cross-sectional view illustrating a cover accessory taken along line C-C of FIG. 2A.

With reference to FIG. 7A, at a front surface of the electronic device 101, a display area (e.g., 160, 205, 505, 605, and 705) that displays information and a black mask (BM) area 725 that does not display information according to disposition of various components may exist.

In this case, when the front cover is closed, a lateral edge area is adjacent to the display thereby lessening any loss in a transfer process of light, but a vertical edge area 713 is separated from a display 705; thus, light loss at the vertical edge area 713 may be greater than that at the lateral edge area.

In various example embodiments of the present disclosure, as shown in FIG. 7B, an edge area may be formed to correspond to an area in which the BM area 725 is projected to a front cover 701. In this case, an area of the vertical edge area 713 may be larger than that of the lateral edge area. Thus, a fluorescent material contained in the vertical edge area 713 may be more than that contained in the lateral edge area; thus, light brightness of the lateral edge area and the vertical edge area 713 may be adjusted to be substantially the same.

FIG. 7A illustrates the electronic device 101 according to an example embodiment of the present disclosure, and the electronic device 101 may include a processor 110, memory 130, communication module 120, display 160, and sensor 140.

The electronic device 101 according to an example embodiment of the present disclosure may include a mobile communication device including the processor 110, the memory 130, the communication module 120, the display 160, and the sensor 140.

The processor 110 according to an example embodiment of the present disclosure may execute a calculation or a data processing of the control and/or communication of at least another constituent element of the electronic device 101. For example, the processor 110 may acquire identification information through the sensor 140 to be described later to determine whether identification information is first identification information or second identification information. The processor 110 may control to display a first screen to a third screen in the display 160 based on the identification information.

The memory 130 according to an example embodiment of the present disclosure may include an internal memory and/or an external memory and store an instruction or data related to at least another constituent element of the electronic device 101. For example, data about first identification information or second identification information for determining identification information to be described later may be stored at the memory 130.

Figure 8A:
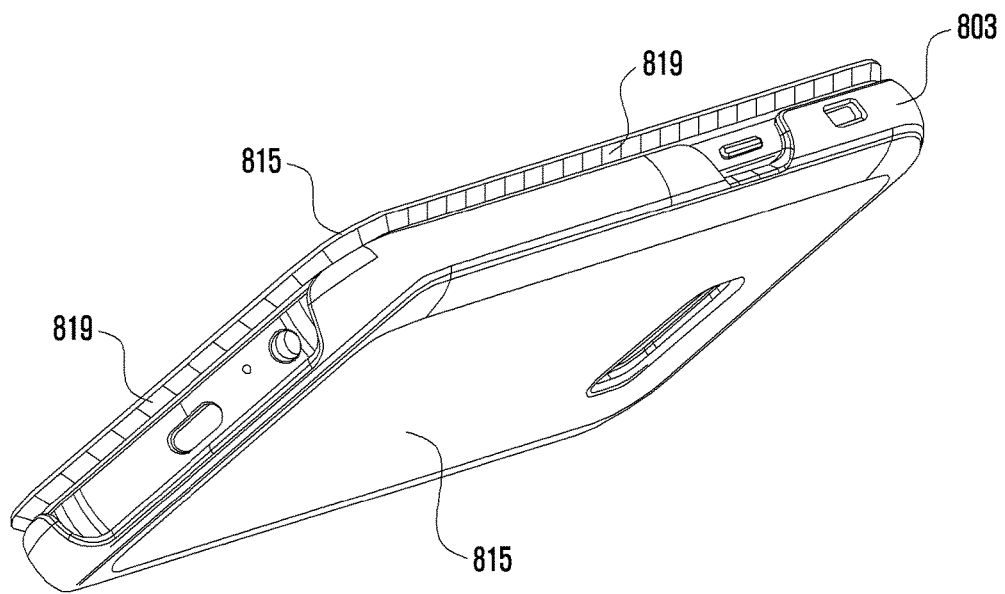
FIG. 8A, FIG. 8B and FIG. 8C are diagrams illustrating a cover accessory according to another example embodiment of the present disclosure.
Figure 8B:
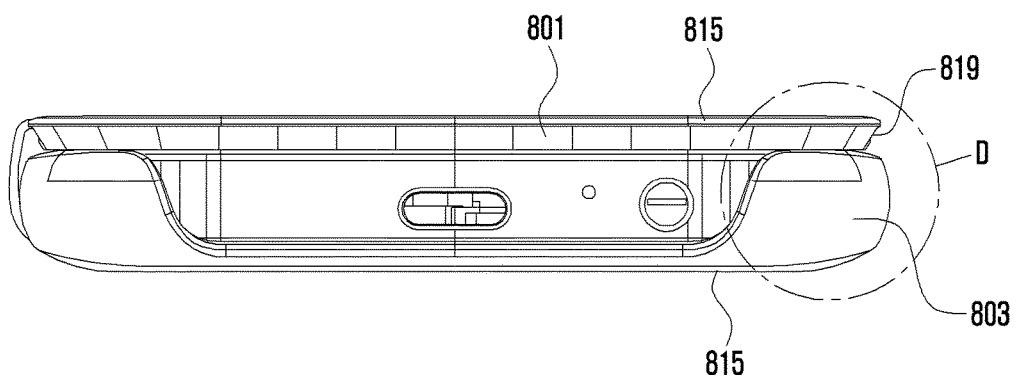
Figure 8C:
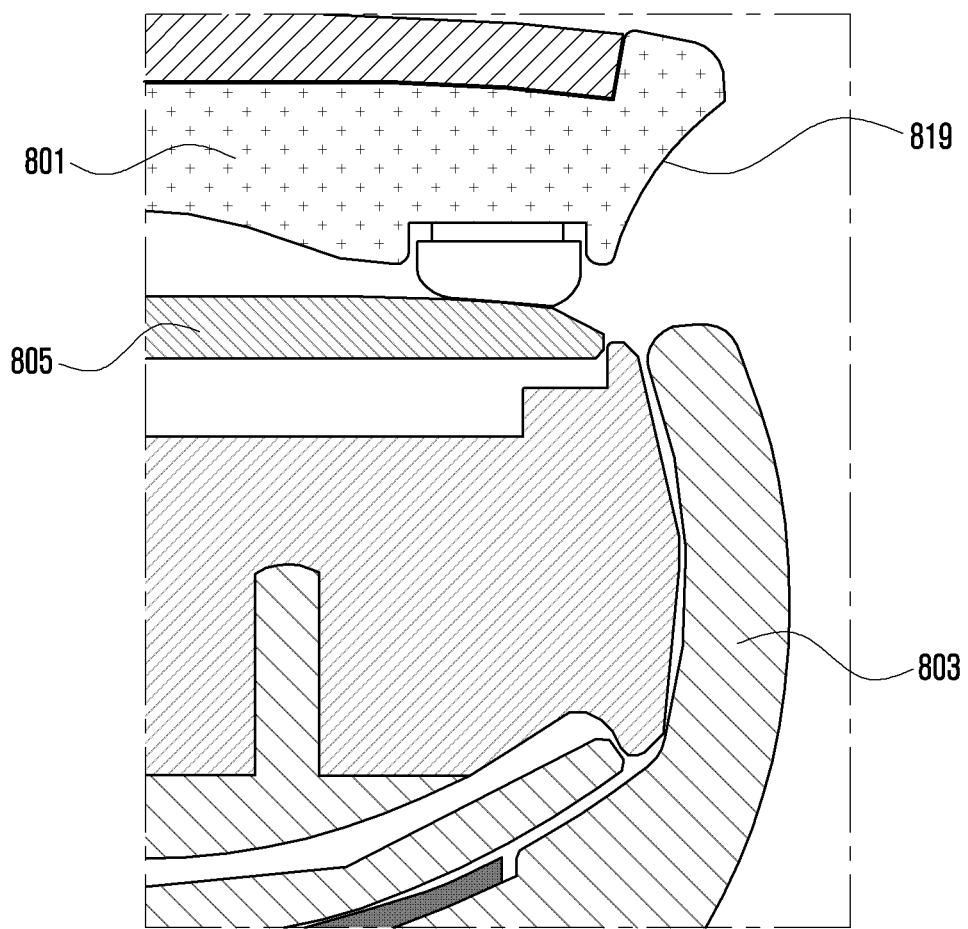

FIGS. 8A and 8B illustrate a cover accessory according to another example embodiment of the present disclosure and illustrate an inclined surface 819 of an edge area. FIG. 8C is an enlarged view illustrating a portion D of FIG. 8B.

As shown in FIGS. 8A to 8C, at the inclined surface 819, a shape indented from the inclined surface in a central area direction may be repeatedly formed, and this may provide an aesthetic feeling to a user forming various patterns to light transferred to an edge area. Further, various kinds of patterns may be formed to be connected to a pattern of a display screen of the electronic device to be described later, and a user may directly recognize an event kind by corresponding a pattern to a specific event.

A cover accessory according to various example embodiments of the present disclosure includes a rear cover that can mount a mobile communication device; and a front cover that can cover a display of the mobile communication device and including a fluorescent material, wherein a light reflection layer facing the display may be formed in the central area of the front cover, and in at least a partial area of an edge area enclosing the central area of the front cover, the light reflection layer may not be formed.

The light reflection layer may emit light from the display in at least a portion of the edge area.

At least a portion of the central area may have a thickness smaller than that of the edge area.

An exterior member having a material different from that of the front cover may be formed on the light reflection layer.

A light shield layer may be formed between the light reflection layer and the exterior member.

One surface of the front cover may cover the display, and the edge area of the front cover may further include an inclined surface formed from the other surface of the front cover toward the one surface and forming an acute angle with the other surface.

At the inclined surface, a shape indented from the inclined surface toward the central area may be repeatedly formed along the edge area.

A cover accessory according to various example embodiments of the present disclosure includes a rear cover in which a mobile communication device is mounted; and a front cover that can cover a display of the mobile communication device and including a fluorescent material, wherein the front cover includes a fluorescent layer facing the display and made of the fluorescent material and a light reflection layer formed on at least a partial area of the fluorescent layer.

In at least a partial area of an edge area enclosing the at least a partial area of the fluorescent layer, the light reflection layer may not be formed.

Figure 9:
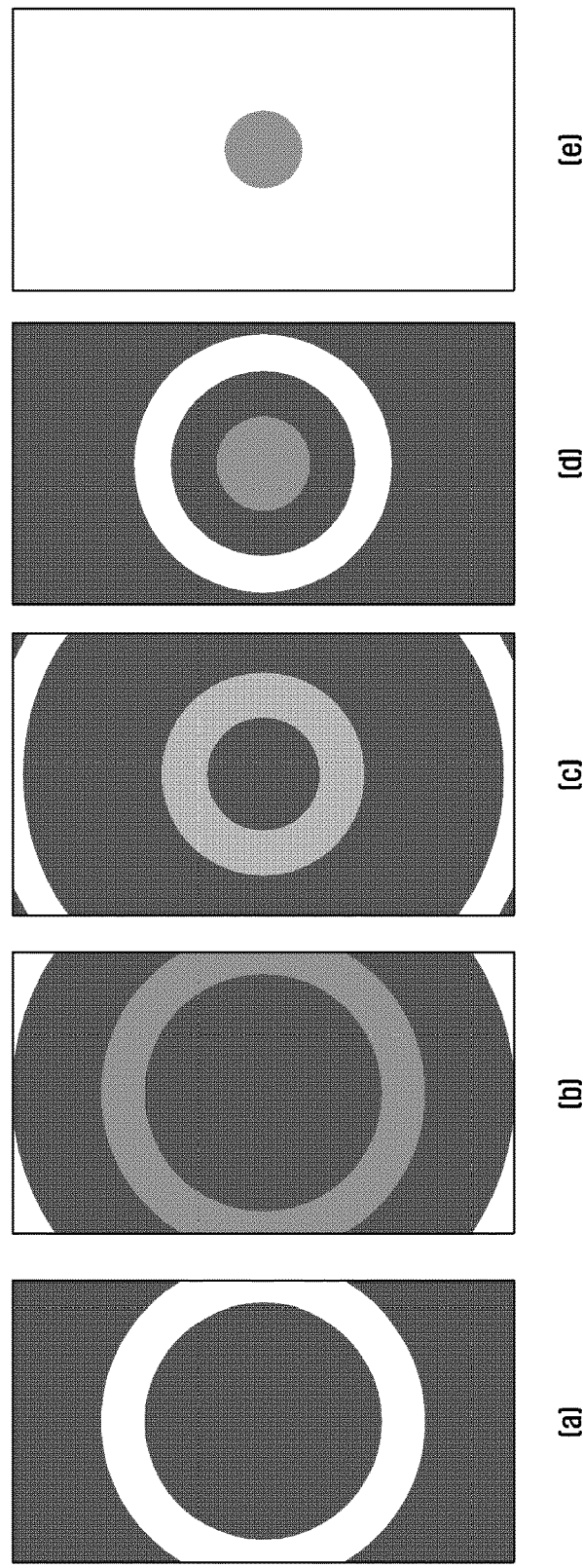
FIG. 9 is a diagram illustrating a pattern of an electronic device display according to an example embodiment of the present disclosure.

FIG. 9 illustrates a pattern displayed in a display of an electronic device according to an example embodiment of the present disclosure. A pattern of FIGS. 9A to 9E is not limited to a pattern changing in time series order and FIGS. 9A to 9E illustrate various patterns according to an order change.

When an area corresponding to a central portion of a display is referred to as a first area and an area enclosing the first area is referred to as a second area, various shapes or colors may be displayed in the first area; and, in at least a portion of the second area, a shape or a color changing by interlocking with a shape or a color displayed in the first area may be variously displayed.

Therefore, by providing a pattern in light emitted from an edge area of the cover accessory, user visibility is enhanced and an aesthetic feeling is provided; and, by corresponding a pattern to a specific event occurring in the electronic device, the user may directly recognize an event kind.

A pattern represented in the display may be various shapes and colors, light emitting patterns, and patterns in which a light emitting cycle changes and a bright screen by turning on of the display or a screen in which flicker of the display is repeated.

A pattern shape is not limited to a shape of FIG. 9 to be described later and may include various shapes such as a circle, rhombus, and star, and such a shape may increase or reduce and appear or disappear. A color of shapes such as a circle, rhombus, and star may be variously changed.

Figure 10A:
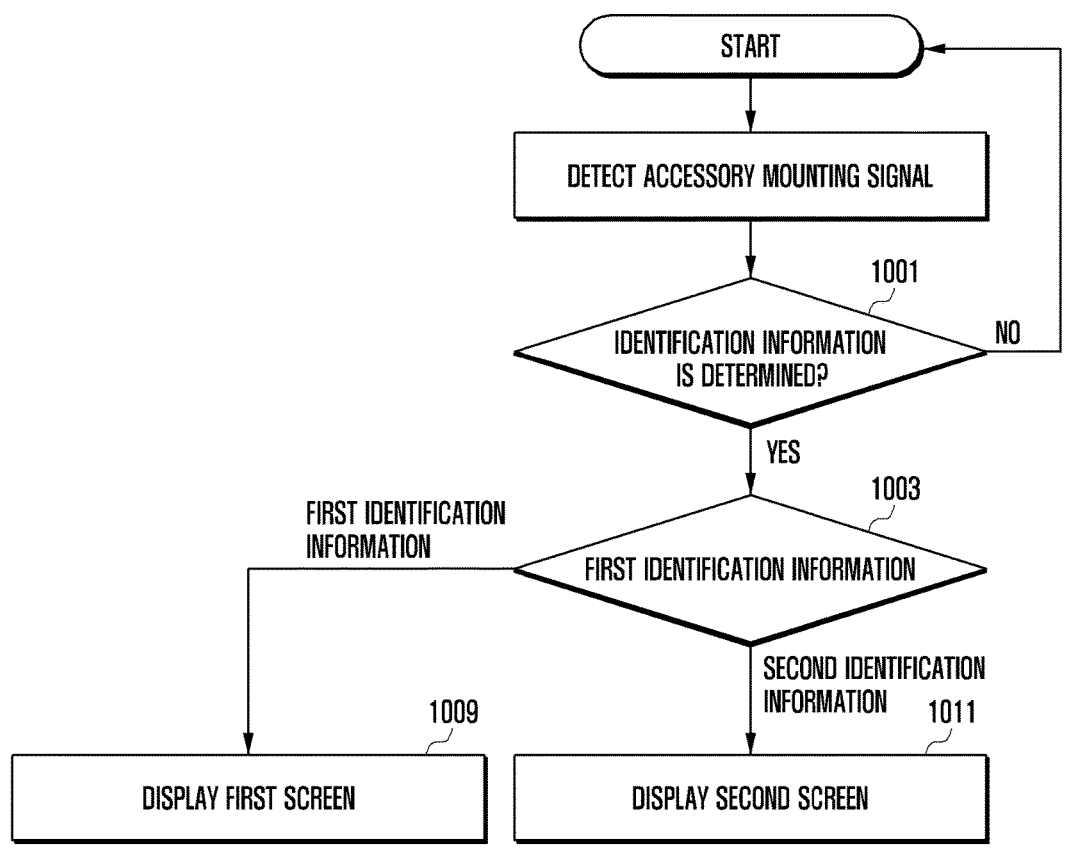
FIG. 10A, FIG. 10B, and FIG. 10C are flowcharts illustrating an operation of an electronic device processor according to an example embodiment of the present disclosure.
Figure 10B:
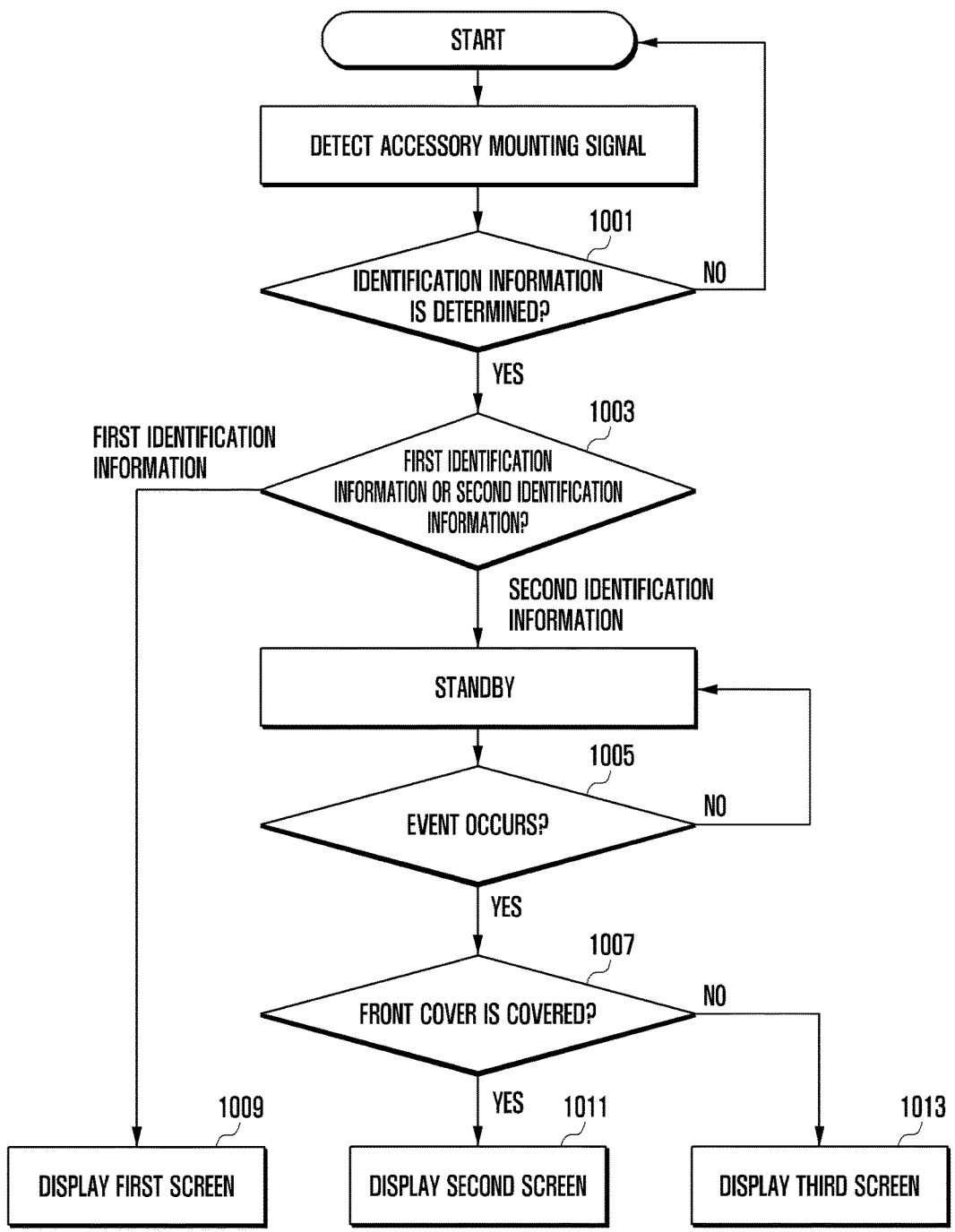
Figure 10C:
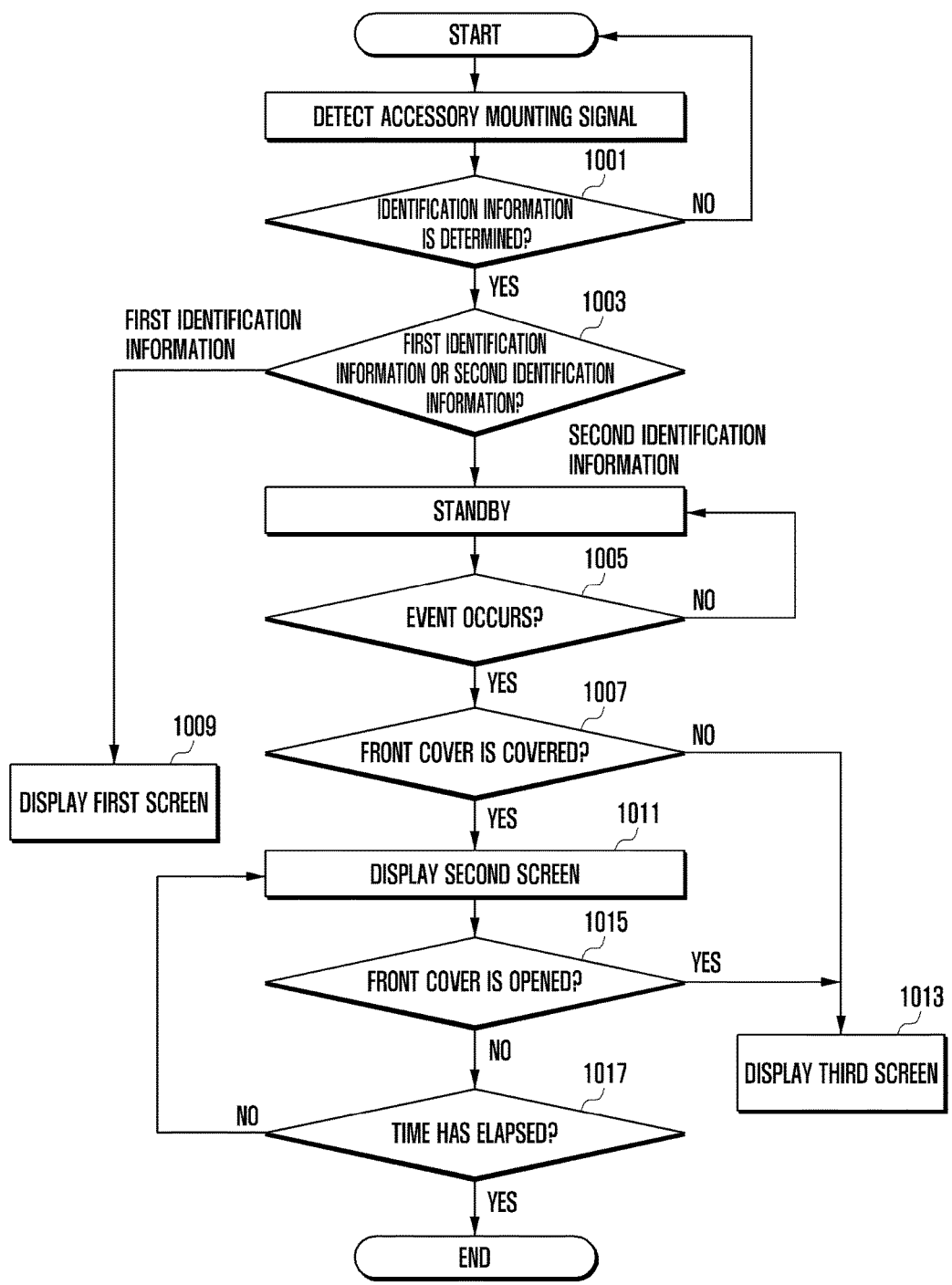

FIGS. 10A-10C are flowcharts illustrating an operation of a processor 110 of an electronic device 101 according to an example embodiment of the present disclosure.

The electronic device 101 according to an example embodiment of the present disclosure may include a display 160, sensor 140, and processor 110. The processor 110 may determine whether a cover accessory is mounted through the sensor 140 and control to display various screens in the display 160 according to a result thereof.

When the electronic device 101 is mounted in the cover accessory, the processor 110 may acquire identification information related to a mounted cover accessory from an identification element at step 1001. The processor 110 compares the acquired identification information with data previously stored at the electronic device at step 1003, and when the acquired identification information corresponds to the first identification information, the processor 110 may control the display of a first screen in the display at step 1009, and when the acquired identification information corresponds to the second identification information, the processor 110 may control the display of a second screen in the display at step 1011.

The first identification information means different kinds of cover accessories instead of a cover accessory according to various example embodiments of the present disclosure. For example, the cover accessory may be a cover accessory that mounts a separate circuit or a simple cover accessory having no function. The first screen may be a display screen corresponding to a cover accessory that mounts a separate circuit and may be a display screen corresponding to another cover accessory.

The second identification information means a cover accessory according to various example embodiments of the present disclosure. When the processor 110 acquires identification information corresponding to second identification information, the processor 110 may control to display the second screen in the display at step 1011. The second screen may be a pattern of various shapes or colors, as shown FIG. 9. Alternatively, the second screen may be a bright screen by the display 160 being turned on or a screen in which flicker of the display 160 is repeated. The second screen may be a screen in which a light emitting pattern of the display 160 changes or a screen in which a light emitting cycle changes.

When identification information received from an identification element corresponds to second identification information, the processor 110 may control a display screen according to whether the front cover is opened or closed at step 1007 in a different manner such that different screens are displayed in each of the open and closed states. Specifically, in a state in which the front cover is closed, when an event has occurred as in operation 1005, the processor 110 may control to display a second screen at step 1011, and in a state in which the front cover is opened, when an event has occurred, the processor 110 may control to display a third screen at step 1013.

The second screen may be a screen in which brightness of the display 160 is adjusted to emit light through an edge area of the front cover, and the third screen may be a screen in which a normal electronic device 101 displays when an event occurs. For example, in a state in which the cover accessory is not mounted, the third screen may be a screen in which the electronic device 101 displays. Alternatively, the third screen may be a screen before brightness of the display 160 is adjusted to the second screen.

The processor 110 may variously change a display pattern of the second screen according to a kind of an event that occurs. For example, in an example embodiment according to the present disclosure, an event kind may be text message reception, phone call reception, and alarm; a shape and a color may be differently represented in the display according to each event; and a change aspect in which a first area and a second area change by interlocking and an operation time may be differently represented.

Specifically, various shapes such as a circle, rhombus, and star may be represented, and such a shape may increase or reduce and appear or disappear. A color of shapes such as a circle, rhombus, and star may be variously changed.

Because a pattern of light emitted through an edge area of the cover accessory is different according to a shape change, a color change, and a change of a change aspect, the user may recognize an event kind even in a state in which the front cover is not opened.

While displaying the second screen in the display at step 1011, when the front cover is opened, the processor 110 may control displaying a third screen in the display at step 1013. As described above, the second screen may be a screen in which brightness of the display 160 is adjusted to emit light through the front cover; and, in a situation in which the front cover is opened, it may be necessary to return brightness of the display 160 to an original state.

Therefore, in various example embodiments of the present disclosure, while the processor 110 displays a second screen at step 1011, the processor 110 determines whether the front cover is opened at step 1015, if the front cover is opened, the processor 110 may control to display a third screen in which a normal electronic device displays an event in the display at step 1013.

After the processor 110 starts to display the second screen in the display at step 1011, the processor 110 may determine whether a time previously stored at the electronic device has elapsed at step 1017, if a time previously stored at the electronic device has elapsed, the processor 110 may stop displaying a screen in the display. For event notification, when the second screen is displayed indefinitely, battery consumption of the electronic device is excessive; thus, when a previously stored time has elapsed, the processor 110 may stop displaying a screen in the display 160.

An electronic device according to various example embodiments of the present disclosure includes a display; a sensor for determining whether a cover accessory is mounted; and a processor, wherein the processor controls to acquire identification information occurring in the cover accessory using the sensor, display a first screen in the display when the identification information corresponds to first identification information previously stored in the electronic device, and display a second screen in the display when the identification information corresponds to second identification information previously stored in the electronic device.

When acquiring the identification information corresponding to the second identification information, the processor may control to differently display a display screen corresponding to the event when an event occurs according to whether a front cover of the cover accessory is opened or closed.

The processor may control to display a pattern of different shapes and different colors in the display according to a kind of the event.

The processor may control to display a second screen in the display when the front cover is covered and to display a third screen in the display when the front cover is opened.

The processor may control to display a shape or a color in the first area corresponding to a central portion of the cover accessory of the display and to display a shape or a color interlocking with a shape or a color displayed in the first area in at least a portion of a second area corresponding to an edge area enclosing the central portion of the cover accessory of the display, as at least a portion of an operation of displaying the second screen in the display.

The second screen may be a screen in which brightness of the display is adjusted to emit light through the front cover, and the third screen may be a normal event display screen.

A method of controlling an electronic device including a display, a sensor for determining whether an accessory for an electronic device is mounted, and a processor that controls the display and the sensor includes receiving, by the processor, identification information of the accessory for the electronic device from the sensor, determining whether the identification information corresponds to identification information previously stored at the electronic device, and controlling the display to differently display a display screen corresponding to the event when an event occurs according to whether a front cover of the accessory for the electronic device is opened or closed.

The method may further include displaying, by the processor, a second screen in the display when the front cover is covered and displaying a third screen in the display when the front cover is opened.

The method may further include displaying, by the processor, different shapes or different color patterns in the display according to a kind of the event.

The method may further include displaying, by the processor, the third screen in the display when the front cover is opened while displaying a second screen in the display.

The method may further include stopping, by the processor, screen display in the display when a previously stored time has elapsed after displaying the second screen in the display.

As described above, a cover accessory according to various example embodiments of the present disclosure can transfer event information occurring in an electronic device to a user even without using a separate circuit and reduce a battery use amount of the electronic device.

An electronic device according to various example embodiments of the present disclosure can perform various screen display controls according to a kind of a cover accessory. Further, the electronic device can recognize an event kind to a user even in a state in which a front cover of a cover accessory is closed through various screen display controls according to the event of the electronic device.

Although example embodiments of the present disclosure have been described in detail hereinabove it should be clearly understood that many variations and modifications of the basic inventive concepts herein described that may appear to those skilled in the art will still fall within the spirit and scope of the example embodiments of the present disclosure as defined in the appended claims.

What is claimed is:

1. A cover accessory, comprising:
a rear cover configured to be mounted on a mobile communication device having a display; and
a front cover configured to cover a display of the mobile communication device and comprising a fluorescent material,
wherein a light reflection layer facing the display is formed in a substantially central area of the front cover, and
wherein in at least a partial area of an edge area enclosing the substantially central area of the front cover, the light reflection layer is not formed.

2. The cover accessory of claim 1, wherein the light reflection layer emits light from the display in at least a portion of the edge area.

3. The cover accessory of claim 1, wherein the edge area has a thickness, and wherein at least a portion of the substantially central area has a thickness that is smaller than that the thickness of the edge area.

4. The cover accessory of claim 1, wherein an exterior member having a material different from that of the front cover is formed on the light reflection layer.

5. The cover accessory of claim 4, wherein a light shield layer is formed between the light reflection layer and the exterior member.

6. The cover accessory of claim 1, wherein one surface of the front cover covers the display, and
wherein the edge area of the front cover further comprises an inclined surface formed from another surface of the front cover oriented toward the one surface and defining an acute angle with respect to the other surface.

7. The cover accessory of claim 6, wherein at the inclined surface, a shape indented from the inclined surface toward the substantially central area is repeatedly formed along the edge area.

8. A cover accessory, comprising:
a rear cover in which a mobile communication device is mounted; and
a front cover configured to cover a display of the mobile communication device and comprising a fluorescent material,
wherein the front cover comprises a fluorescent layer facing the display and made of the fluorescent material, and a light reflection layer is formed on at least a partial area of the fluorescent layer.

9. The cover accessory of claim 8, wherein in at least a partial area of an edge area enclosing the at least a partial area of the fluorescent layer, the light reflection layer is not formed.

10. The cover accessory of claim 8, wherein the front cover is configured with a central area and an edge area enclosing the central area, and
wherein at least a portion of the central area has a thickness and the edge area has a thickness, the thickness of the central area being smaller than the thickness of the edge area.

11. The cover accessory of claim 8, wherein an exterior member having a material different from that of the front cover is formed on the light reflection layer.

12. The cover accessory of claim 11, wherein a light shield layer is formed between the light reflection layer and the exterior member.

13. The cover accessory of claim 10, wherein one surface of the front cover covers the display, and
wherein the edge area of the front cover further comprises an inclined surface formed from another surface of the front cover oriented toward the one surface and forming an acute angle with respect to the other surface.

14. The cover accessory of claim 13, wherein at the inclined surface, a shape indented from the inclined surface toward the central area is repeatedly formed along the edge area.

* * * * *